United States Patent
Lee et al.

(10) Patent No.: US 8,289,073 B2
(45) Date of Patent: Oct. 16, 2012

(54) SEMICONDUCTOR DEVICE HAVING VOLTAGE REGULATOR

(75) Inventors: Chang-Ju Lee, Suwon-si (KR); Hyoung-Rae Kim, Hwaseong-si (KR); San-Ho Byun, Bucheon-Si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 143 days.

(21) Appl. No.: 12/759,942

(22) Filed: Apr. 14, 2010

(65) Prior Publication Data

US 2010/0295522 A1    Nov. 25, 2010

(30) Foreign Application Priority Data

May 21, 2009  (KR) .................. 10-2009-0044543

(51) Int. Cl.
  *G05F 1/10*  (2006.01)
  *G05F 3/02*  (2006.01)
(52) U.S. Cl. ..................................... 327/540
(58) Field of Classification Search .............. 327/538, 327/540, 541, 543; 323/273, 280
  See application file for complete search history.

(56) References Cited

U.S. PATENT DOCUMENTS

| 5,917,311 | A | 6/1999 | Brokaw | |
| 6,930,540 | B2* | 8/2005 | Sommer et al. | 327/540 |
| 7,019,585 | B1 | 3/2006 | Wilson et al. | |
| 2008/0191792 | A1* | 8/2008 | Ogiwara et al. | 327/541 |
| 2009/0302824 | A1* | 12/2009 | Kim et al. | 323/313 |

FOREIGN PATENT DOCUMENTS

| JP | 11-338560 | 12/1999 |
| KR | 1020080009099 | 1/2008 |

* cited by examiner

*Primary Examiner* — Quan Tra
(74) *Attorney, Agent, or Firm* — F. Chau & Associates, LLC

(57) ABSTRACT

A semiconductor device includes a voltage regulator. The device includes an operational amplifier configured to compare an input voltage with a feedback voltage and output an output voltage, an up-resistor connected between an output of the operational amplifier and a first node, a down-resistor connected between a second node and a ground voltage terminal, and a switching unit including a fuse box connected between a third node outputting the feedback voltage and a fourth node having a variable resistance value, and configured to connect the first node with the fourth node and the second node with the third node, or connect the first node with the third node and the second node with the fourth node.

17 Claims, 4 Drawing Sheets

US 8,289,073 B2

SEMICONDUCTOR DEVICE HAVING VOLTAGE REGULATOR

CROSS-REFERENCE TO RELATED APPLICATION

This application claims priority under 35 U.S.C. §119 to Korean Patent Application No. 10-2009-0044543, filed on May 21, 2009, the disclosure of which is incorporated by reference in its entirety herein.

BACKGROUND

1. Technical Field

Exemplary embodiments of the inventive concept relate to a semiconductor device having a voltage regulator.

2. Discussion of Related Art

A voltage regulator is an electrical regulator designed to automatically maintain a constant voltage level. A voltage regulator may include an operational amplifier, which amplifies a difference between input voltages according to an amplification characteristic value of the operational amplifier and outputs the amplified difference as an output voltage. In a voltage regulator using such an operational amplifier, a bias resistance is changed by internal resistors, such that the operational amplifier can output a desired output voltage.

A voltage regulator including an operational amplifier that obtains a desired output voltage due to such a bias resistance may be used in electronic circuits, which require stable and specific constant voltages. However, when a very accurate voltage is required, a voltage regulator including the operational amplifier is not sufficient.

Thus, there is a need for a voltage regulator including an operational amplifier that can output more accurate voltages.

SUMMARY

An exemplary embodiment of the inventive concept includes a semiconductor device having a voltage regulator, which includes one fuse box and a plurality of switches connecting the fuse box with bias resistors, and connecting the fuse box with desired bias resistors as necessary to change a total bias resistance of the voltage regulator, thereby regulating an output voltage.

An exemplary embodiment of the inventive concept includes a semiconductor device having a voltage regulator. The semiconductor devices includes an operational amplifier configured to compare an input voltage with a feedback voltage and output an output voltage, an up-resistor connected between output of the operational amplifier and a first node, a down-resistor connected between a second node and a ground voltage terminal, and a switching unit including a fuse box connected between a third node outputting the feedback voltage and a fourth node having a variable resistance value, and configured to connect the first node with the fourth node and the second node with the third node, or connect the first node with the third node and the second node with the fourth node.

An exemplary embodiment of the inventive concept includes a semiconductor device having a voltage regulator. The semiconductor device includes an operational amplifier configured to compare an input voltage received through a first input terminal with a feedback voltage received through a second input terminal, and output an output voltage through an second output terminal, an up-resistor connected between the output terminal and the second input terminal to increase the output voltage, a down-resistor connected between the second input terminal and a ground voltage terminal to decrease the output voltage, and a switching unit configured to increase a resistance value between the down-resistor and the second input terminal when the output voltage is higher than a desired voltage, and increase a resistance value between the up-resistor and the second input terminal when the output voltage is lower than the desired voltage. The switching unit may include a single fusebox to respectively increase the resistance values.

A semiconductor device according to an exemplary embodiment of the inventive concept includes an operational amplifier (OP-AMP), a fusebox, first through fourth switches, and first through second resistors. A first input terminal of the OP-AMP receives a reference voltage and a second input terminal of the OP-AMP receives a feedback voltage. An input of the fusebox is connected to the second input terminal and an output of the fusebox is connected to an output terminal of the OP-AMP. The fusebox is configurable to one of a plurality of different resistance values. The first resistor is connected between the output terminal of the OP-AMP and the first switch and second switches, and the second resistor is connected between a ground terminal and the second and fourth switches.

The first switch may be configured to connect the first resistor to the output of the fusebox, the second switch may be configured to connect the second resistor to the output of the fusebox, the third switch may be configured to connect the first resistor to the input of the fusebox, and the fourth switch may be configured to connect the second resistor to the input of the fusebox.

The semiconductor may further include a control signal setting circuit configured to output one of first control signals to open the first and fourth switches and close the second and third switches or output second control signals to open the second and third switches and close the first and fourth switches. The control signal setting circuit may be configured to output the first control signals when an output voltage of the output terminal of the OP-AMP exceeds a desired voltage and output the second control signal when the output voltage of the output terminal of the OP-AMP is less than the desired voltage.

BRIEF DESCRIPTION OF THE DRAWINGS

Exemplary embodiments of the inventive concept are described in further detail below with reference to the accompanying drawings.

DETAILED DESCRIPTION OF THE EMBODIMENTS

The inventive concept will now be described more fully with reference to the accompanying drawings in which some exemplary embodiments thereof are shown. The inventive concept, however, may be embodied in many alternate forms and should not be construed as limited to only the exemplary embodiments set forth herein. Like numbers refer to like elements throughout the description of the figures. It will be understood that when an element is referred to as being "connected" or "coupled" to another element, it can be directly connected or coupled to the other element or intervening elements may be present.

Figure 1:
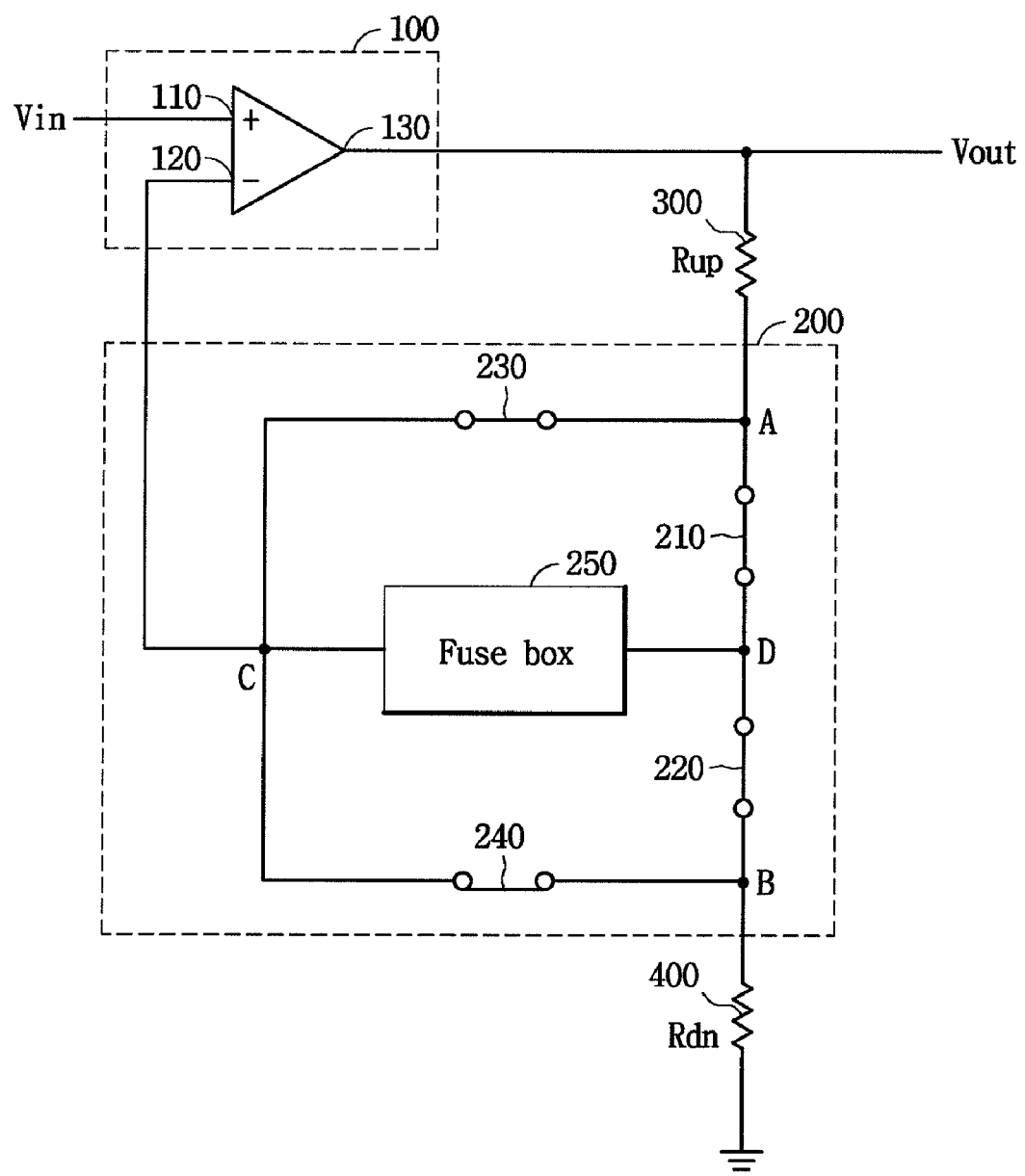
FIG. 1 is a block diagram of a semiconductor device having a voltage regulator according to an exemplary embodiment of the inventive concept.

FIG. 1 is a block diagram of a semiconductor device having a voltage regulator according to an exemplary embodiment of the inventive concept. Referring to FIG. 1, a semiconductor device having a voltage regulator includes an operational amplifier 100, a switching unit 200, an up-resistor 300 and a down-resistor 400.

The operational amplifier 100 receives a reference input voltage Vin through a reference input terminal 110, and receives a voltage divided by the switching unit 200, the up-resistor 300 and the down-resistor 400 as a feedback voltage through a feedback input terminal 120. Then, the operational amplifier 100 compares the reference voltage with the feedback voltage, and outputs an output voltage Vout through an output terminal 130.

The operational amplifier 100 used herein may be selected from any type that is available in the field of electronics. The circuit layout of the operational amplifier will vary according to the type selected, and thus a detailed description thereof will be omitted.

The switching unit 200 is connected with the up-resistor 300 via a first node A, connected with the down-resistor 400 via a second node B, and connected with the feedback input terminal 120 of the operational amplifier 100 via a third node C. In other words, the switching unit 200 is connected between the up-resistor 300, the down-resistor 400, and the feedback input terminal 120. Further, the switching unit 200 includes a fuse box 250, and a plurality of switches 210, 220, 230 and 240 controlling respective connections between the first to fourth nodes A, B, C and D.

The first switch 210 is connected between the first node A and the fourth node D, and the second switch 220 is connected between the second node B and the fourth node D. Further, the third switch 230 is connected between the first node A and the third node C, and the fourth switch 240 is connected between the second node B and the third node C.

When a fabrication process of a semiconductor device has completed (e.g., the semiconductor device of FIG. 1), semiconductor chips may be formed on a wafer, and then the wafer may be cut into pieces and packaged. However, before the packaging, the semiconductor chips may undergo an electrical die sorting (EDS) test for testing electrical characteristics thereof to examine performances of the semiconductor chips. The EDS test may include applying an input voltage to semiconductor chips on a wafer, comparing measured output voltages with a desired voltage (e.g., a reference voltage), and determining whether or not the measured output voltages are in a normal range, thereby potentially detecting defective chips.

In a default state (e.g., an initial state) of the switching unit 200, all the switches 210, 220, 230 and 240 are connected as shown in FIG. 1. For example, during the default state, all of the switches 210, 220, 230, and 240 may be closed and the output voltage Vout is measured and compared with a desired voltage (e.g., a reference voltage). When the output voltage Vout is higher or lower than the desired voltage, the switches 210, 220, 230 and 240 may be controlled to adjust the output voltage Vout to be the desired voltage.

In at least one exemplary embodiment, the plurality of switches 210, 220, 230 and 240 include metal fuses. Thus, the switches may be disconnected (e.g., opened) by cutting a respective fuse, or the connections between the nodes A, B, C and D may be retained by keeping the fuses connected (e.g., uncut).

The plurality of switches 210, 220, 230 and 240 may be analog switches and include for example, one of n-type metal oxide semiconductor (NMOS) transistors, p-type metal oxide semiconductor (PMOS) transistors, or complementary metal oxide semiconductor (CMOS) transistors. When a transistor is used as the analog switch, a control signal may be applied to a gate terminal thereof to activate (e.g., turn on/close) or deactivate (e.g., turn off/open) the analog switch. When the voltage regulator is used in the semiconductor device, operations of the analog switches may be controlled by one or more control signals received from a source external the semiconductor device or one or more internally generated control signals. A process in which the analog switches 210, 220, 230 and 240 regulate the connections between the nodes A, B, C and D in response to the one or more control signals will be described with reference to FIG. 5 below.

The fuse box 250 may be a resistor box serving as a resistor, and may include a plurality of resistors and a plurality of fuses. The resistance of the fuse box 250 may change depending on the connection state of the fuses, thereby changing the resistance of node D. An exemplary embodiment of the fuse box 250 will be described with reference to FIG. 4 below.

The up-resistor 300 and the down-resistor 400 may be bias resistors used to regulate the output voltage Vout in the voltage regulator including the operational amplifier 100.

During the initial state of the switching unit 200 in which all the switches 210, 220, 230 and 240 are connected, the output voltage Vout output to the output terminal 130 of the operational amplifier 100 may be expressed by Equation 1 as follows:

$$Vout=Vin(1+Rup/Rdn) \qquad <\text{Equation 1}>,$$

where Rup is a resistance value of the up-resistor 300, and Rdn is a resistance value of the down-resistor 400. When the up-resistor 300 has a higher resistance value, the operational amplifier 100 has a higher gain, thereby increasing the output voltage Vout. However, when the down-resistor 400 has a higher resistance value, the operational amplifier 100 has a lower gain, thereby decreasing the output voltage Vout. When there is a difference between the output voltage Vout and the desired voltage, the connections between the switches 210, 220, 230 and 240 are changed to change a total bias resistance by the up-resistor 300 and the down-resistor 400, such that the output voltage Vout becomes the same as the desired voltage.

Figure 2:
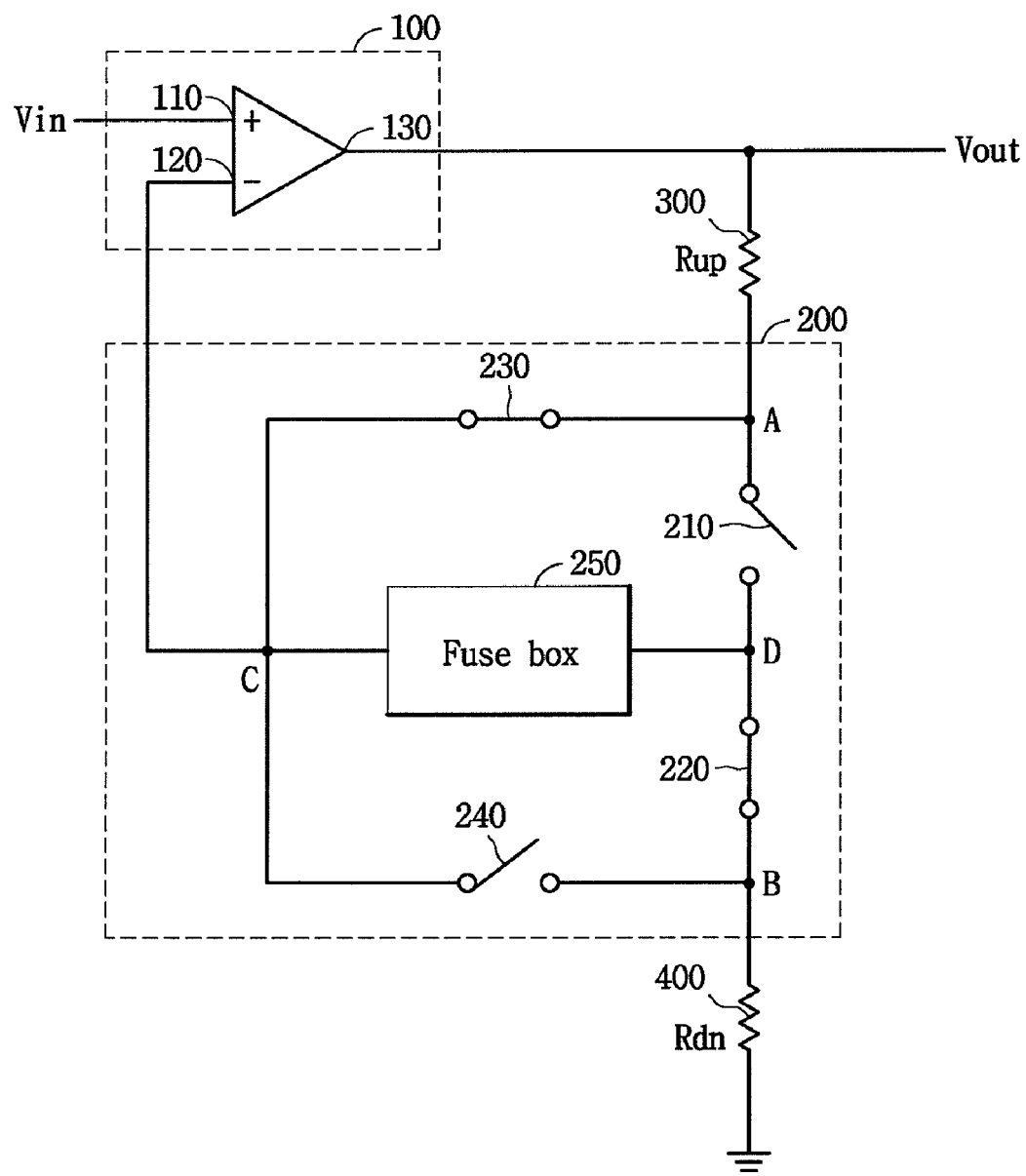
FIG. 2 illustrates a block diagram for explaining a method of decreasing an output voltage when the output voltage is higher than a desired voltage according to an exemplary embodiment of the inventive concept.

A method of making the output voltage Vout the same as the desired voltage by controlling the switches 210, 220, 230 and 240 of the switching unit 200 and changing the total bias resistance will be described with reference to FIGS. 2 and 3 below in accordance with an exemplary embodiment of the inventive concept. FIG. 2 illustrates a block diagram for explaining a method of decreasing an output voltage when the output voltage is higher than a desired voltage according to an exemplary embodiment of the inventive concept.

Referring to FIG. 2, when the output voltage Vout of the semiconductor device having the voltage regulator is higher than a desired voltage, the switching unit 200 turns on (e.g., closes) the third switch 230, which is connected between the first and third nodes A and C. Further, the switching unit 200 turns on the second switch 220 (e.g., closes), which is connected between the second and fourth nodes B and D. Moreover, the switching unit 200 turns off the first switch 210 (e.g., opens), which is connected between the first and fourth nodes A and D, and turns off the fourth switch 240 (e.g., opens), which is connected between the second and third nodes B and C. Accordingly, the down-resistor 400 is serially connected with the fuse box 250, such that a total resistance value between the ground voltage terminal and the third node C is increased.

For example, the combined resistance of the fusebox 250 and the down-resistor 400 due to this serial connection can be interpreted as increasing the resistance value of the down-resistor 400 (e.g., Rdn) according to Equation 1. Thus, the operational amplifier 100 due to the connections of the switching unit 200 in FIG. 2 has a lower gain, and the output voltage Vout is decreased.

As described above, when the output voltage Vout is higher than the desired voltage, the first and fourth switches 210 and 240 are turned off in the default state to serially connect the down-resistor 400 with the fuse box 250, thereby decreasing a gain of the operational amplifier 100 and decreasing a level of the output voltage Vout.

When the switches 210, 220, 230 and 240 of the switching unit 200 are fuses, the switches turned off by the above-described operations can be performed by cutting the fuses of the first and fourth switches 210 and 240. For example, the first and fourth switches 210 and 240 may be cut using a laser in at least one exemplary embodiment of the inventive concept.

Figure 3:
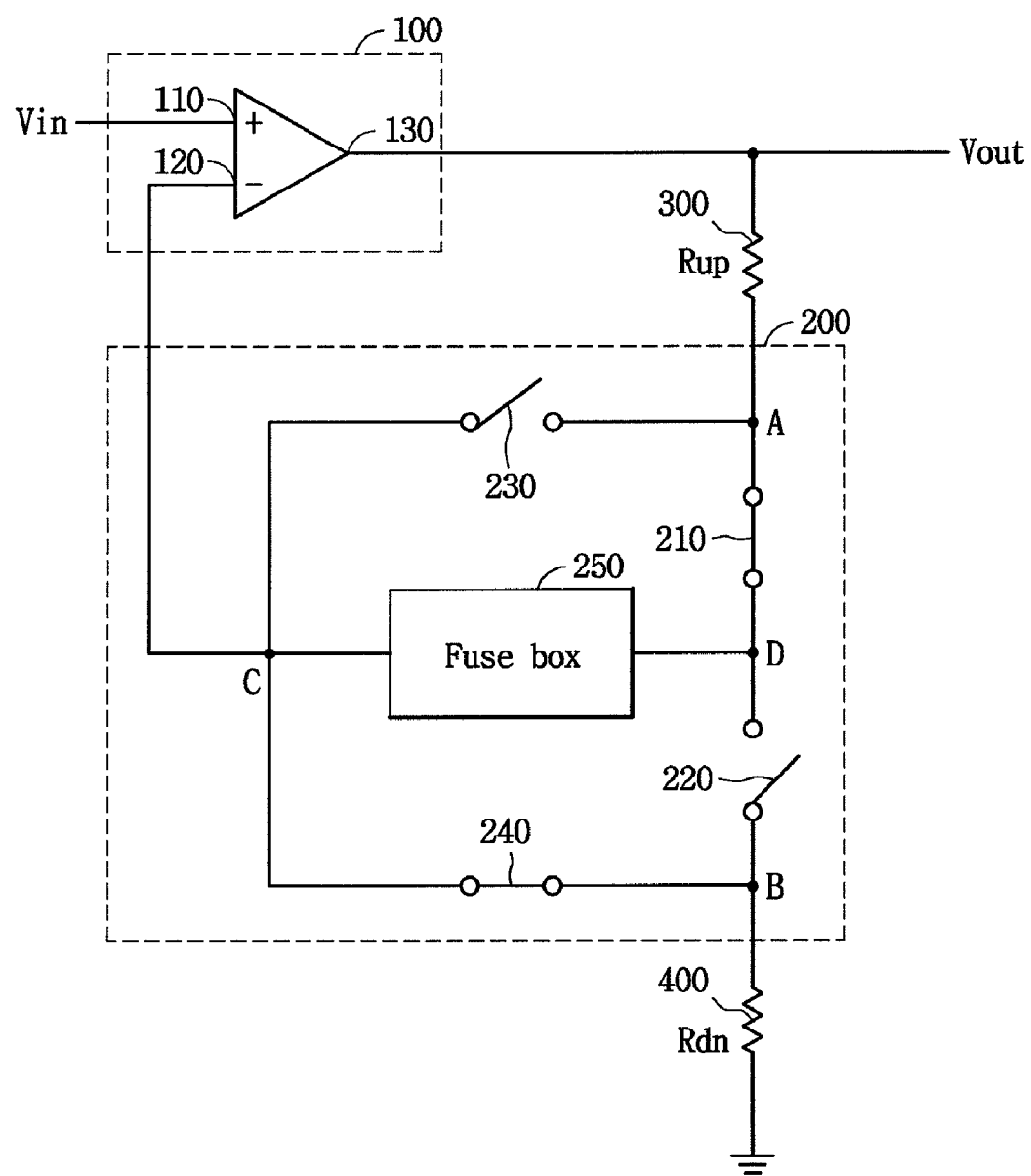
FIG. 3 illustrates a block diagram for explaining a method of increasing an output voltage when the output voltage is lower than a desired voltage according to an exemplary embodiment of the inventive concept.

FIG. 3 illustrates a block diagram for explaining a method of increasing the output voltage Vout when the output voltage Vout is lower than the desired voltage according to an example embodiment of the inventive concept. Referring to FIG. 3, when the output voltage Vout is lower than the desired voltage, the switching unit 200 turns on the first switch 210 (e.g., closes), which is connected between the first node A and the fourth node D, and turns on the fourth switch 240 (e.g., closes), which is connected between the second node B and the third node C to increase the output voltage Vout. Further, the switching unit 200 turns off the third switch 230 (e.g., opens), which is connected between the first node A and the third node C, and turns off the second switch 220 (e.g., opens), which is connected between the second node B and the fourth node D. Accordingly, the up-resistor 300 is serially connected with the fuse box 250, such that a total resistance value between the output terminal 130 of the operational amplifier 100 and the third node C is increased. For example, the combined resistance of the fuse box 250 and the up-resistor 300 due to this serial connection can be interpreted as an increasing the resistance value of the up-resistor 300 (e.g., Rup) according to Equation 1. Thus, the operational amplifier 100 due to the connections of the switching unit 200 in FIG. 3 has a higher gain, and the output voltage Vout is increased.

As described above, when the output voltage Vout is lower than the desired voltage, the second and third switches 220 and 230 are turned off (e.g., opened) in the default state to serially connect the up-resistor 300 with the fuse box 250, thereby increasing a gain of the operational amplifier 100 and increasing a level of the output voltage Vout.

When the switches 210, 220, 230 and 240 of the switching unit 200 are fuses, the switches turned off by the above-described operations can be performed by cutting the fuses of the second and third switches 220 and 230. For example, the second and third switches 220 and 230 may be cut using a laser.

Figure 4:
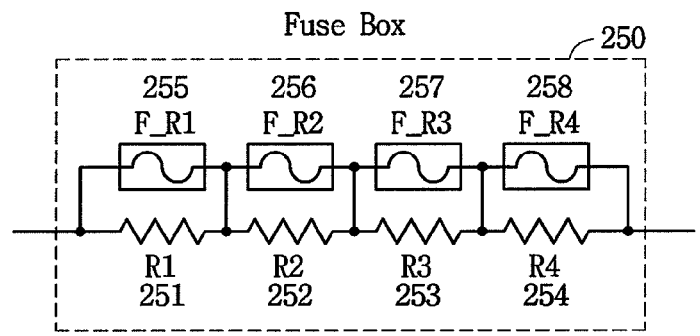
FIG. 4 illustrates a fuse box of FIG. 1 according to an exemplary embodiment of the inventive concept.

FIG. 4 illustrates the fuse box 250 of FIG. 1 according to an exemplary embodiment of the inventive concept. The fuse box 250 includes a plurality of resistors 251, 252, 253 and 254, which are serially connected with each other, and a plurality of fuses 255, 256, 257 and 258, which are connected in parallel with the resistors 251, 252, 253 and 254, respectively, and serially connected with each other.

A total resistance value of the fuse box 250 may be changed by disconnecting one or more of the fuses 255, 256, 257 and 258. For example, to use all the resistors 251, 252, 253 and 254, all the fuses 255, 256, 257 and 258 may be cut. In this example, the total resistance value of the fuse box 250 is R1+R2+R3+R4, which is obtained by serially connecting all the resistors 251, 252, 253 and 254.

As another example, to use the resistors 251, 252 and 253 only, the corresponding fuses 255, 256 and 257 may be cut. In this example, the total resistance value of the fuse box 250 is R1+R2+R3, which is obtained by serially connecting the resistors 251, 252 and 253.

When the connections between all the fuses 255, 256, 257 and 258 are retained, the fuse box 250 does not have a resistance value. In this example, the output voltage of the semiconductor device having the voltage regulator is determined only by the resistances of the up- and down-resistors 300 and 400.

As described above, the fuse box 250 is serially connected with the up- or down-resistor 300 or 400 due to the control of the switches 210, 220, 230 and 240, and may substantially change the resistance value of the up- or down-resistor 300 or 400.

Figure 5:
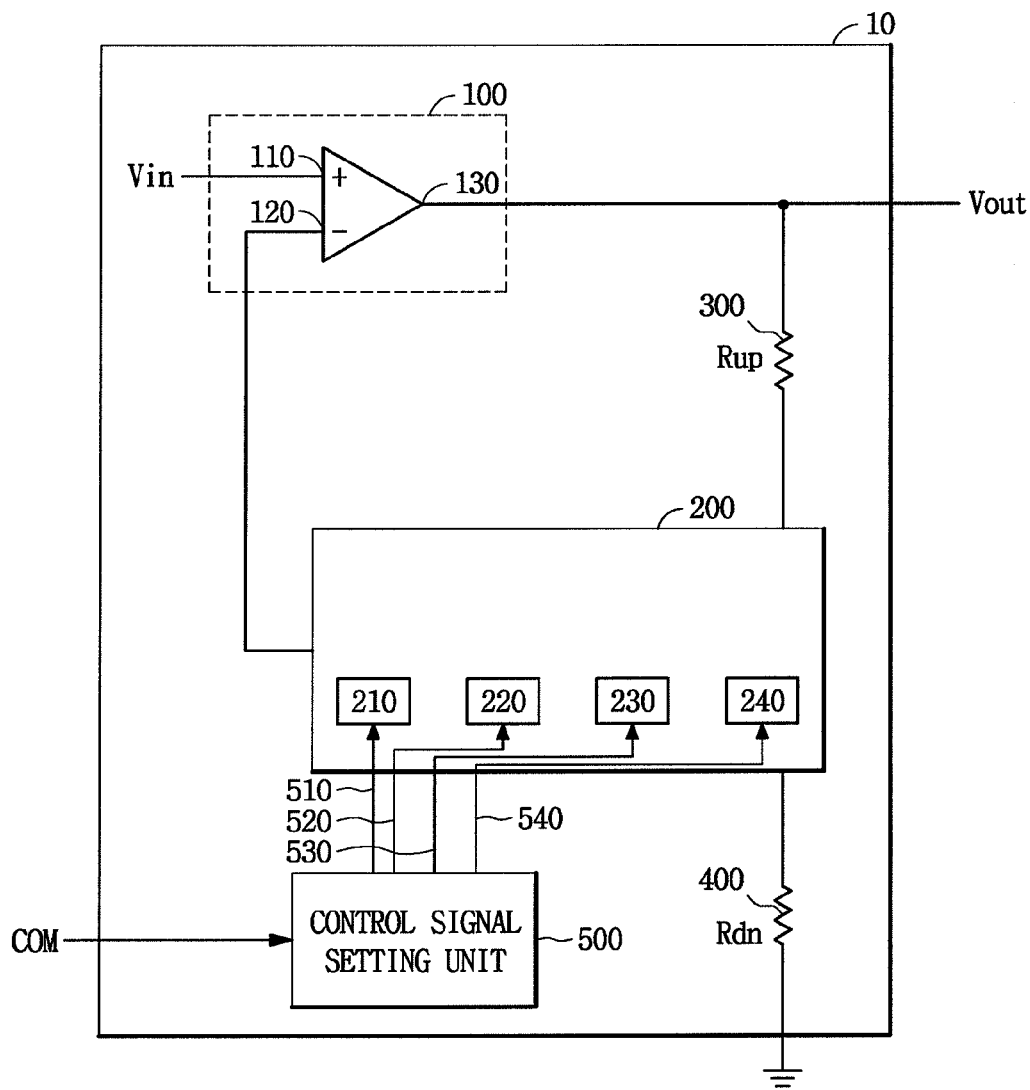
FIG. 5 illustrates a block diagram of a semiconductor device of FIG. 1 having a voltage regulator according to an exemplary embodiment of the inventive concept.

FIG. 5 illustrates the semiconductor device of FIG. 1, in which the switches (e.g., 210, 220, 230, and 240) of the switching unit 200 are MOS transistors according to an exemplary embodiment of the inventive concept. An internal structure of the switching unit 200 is the substantially the same as shown in FIG. 1, and thus its illustration is omitted in FIG. 5. For example, the switching unit 200 of the semiconductor device of FIG. 5 (e.g., 10) includes the fuse box 250 and the first to fourth nodes A, B, C, and D of FIG. 1.

Further, the switching unit 200 of the semiconductor device 10 includes switches 210, 220, 230 and 240, which are MOS transistors.

Referring to FIGS. 1 and 5, the first switch 210 is connected between the first node A and the fourth node D, and the second switch 220 is connected between the second node B and the fourth node D. Further, the third switch 230 is connected between the first node A and the third node C, and the fourth switch 240 is connected between the second node B and the third node C. As shown in FIG. 5, the semiconductor device may further include a control signal setting unit 500 generating control signals 510, 520, 530 and 540 in response to an external control signal COM to control the switches 210, 220, 230 and 240. The first control signal 510 controls the first switch 210, and the second control signal 520 controls the second switch 220. Further, the third control signal 530 controls the third switch 230, and the fourth control signal 540 controls the fourth switch 240.

For example, when the output voltage Vout is higher than the desired voltage, to decrease a level of the output voltage Vout, the control signal setting unit 500 inactivates the first and fourth control signals 510 and 540 and activates the second and third control signals 520 and 530 in response to the external control signal COM. Accordingly, the first and fourth switches 210 and 240 of the switching unit 200 are turned off respectively in response to the first and fourth control signals 510 and 540, and the second and third switches 220 and 230 are turned on respectively in response to the second and third control signals 520 and 530. Thus, the fuse box is serially connected with the down-resistor 400, such that the total resistance value between the feedback input terminal 120 of the operational amplifier 100 and the ground voltage terminal is increased. Consequently, the operational amplifier 100 has a lower gain, and the level of the output voltage Vout is decreased.

When the output voltage Vout is lower than the desired voltage, to increase a level of the output voltage Vout, the control signal setting unit 500 activates the first and fourth control signals 510 and 540 and inactivates the second and third control signals 520 and 530 in response to the external control signal COM. Accordingly, the first and fourth switches 210 and 240 of the switching unit 200 are turned on respectively in response to the first and fourth control signals 510 and 540, and the second and third switches 220 and 230 are turned off respectively in response to the second and third control signals 520 and 530. Thus, the fuse box is serially connected with the up-resistor 300, such that the total resistance value between the output terminal 130 and the feedback input terminal 120 of the operational amplifier 100 is increased. Consequently, the operational amplifier 100 has a higher gain, and the level of the output voltage Vout is increased.

According to at least one embodiment of the inventive concept, a semiconductor device having a voltage regulator using an operational amplifier can be manufactured in a smaller area since it uses one fuse box. Further, a bias resistance value of the voltage regulator can be changed depending on connections of a plurality of switches.

Having described exemplary embodiments of the inventive concept, it should be understood that the invention is not limited to the disclose embodiments, but, on the contrary, is intended to cover various modifications and equivalent arrangements included within the spirit and scope of the disclosure.

What is claimed is:

1. A semiconductor device having a voltage regulator comprising:
   an operational amplifier configured to compare an input voltage with a feedback voltage and output an output voltage;
   an up-resistor connected between an output of the operational amplifier a first node;
   a down-resistor connected between a second node and a ground voltage terminal; and
   a switching unit including a fuse box connected between a third node outputting the feedback voltage and a fourth node having a variable resistance value, and configured to connect the first node with the fourth node and the second node with the third node, or connect the first node with the third node and the second node with the fourth node,
   wherein at least a part of the output voltage is applied across the up-resistor,
   wherein the switching unit includes:
      a first switch configured to connect the first node with the fourth node;
      a second switch configured to connect the second node with the fourth node;
      a third switch configured to connect the first node with the third node; and
      a fourth switch configured to connect the second node with the third node.

2. The semiconductor device according to claim 1, wherein each of the first to fourth switches is a fuse, and the connections between the first to fourth nodes are controlled by cutting the fuses.

3. The semiconductor device according to claim 1, wherein the first to fourth switches are metal oxide semiconductor (MOS) transistors.

4. The semiconductor device according to claim 3, further comprising a control signal setting unit outputting a plurality of control signals to control the MOS transistors in response to an external signal.

5. The semiconductor device according to claim 1, wherein the fuse box includes:
   a plurality of resistors serially connected with each other; and
   a plurality of fuses connected in parallel with the resistors, respectively, and serially connected with each other.

6. A semiconductor device having a voltage regulator, comprising:
   an operational amplifier configured compare an input received through a first input terminal with a feedback voltage received through a second input terminal, and output an output voltage through an output terminal;
   an up-resistor connected between the terminal and the second input terminal to increase the output voltage;
   a down-resistor connected between the second input terminal and a ground voltage terminal to decrease the output voltage; and
   a switching unit configured to increase a resistance value between the down-resistor and the second input terminal when the output voltage is higher than a desired voltage, and increase a resistance value between the up-resistor and the second input terminal when the output voltage is lower than the desired voltage,
   wherein at least a part of the output voltage is applied across the up-resistor,
   wherein the switching unit includes:
      a fuse box having a variable resistance value;
      a first switch connected between the up-resistor and the fuse box;
      a second switch connected between the down-resistor and the fuse box;
      a third switch connected between the up-resistor and the second input terminal of the operational amplifier; and
      a fourth switch connected between the down-resistor and the second input terminal of the operational amplifier,
   wherein the first and fourth switches are turned off and the second and third switches are turned on when the output voltage is higher than the desired voltage, and the first and fourth switches are turned on and the second and third switches are turned off when the output voltage is lower than the desired voltage.

7. The semiconductor device according to claim 6, wherein the output voltage of the operational amplifier is increased as a total resistance value between the second input terminal and the output terminal is increased.

8. The semiconductor device according to claim 6, wherein the output voltage of the operational amplifier is decreased as a total resistance value between the second input terminal and the ground voltage terminal is increased.

9. The semiconductor device according to claim 6, wherein the fuse box includes:
   a plurality of resistors serially connected with each other; and
   a plurality of fuses connected in parallel with the resistors, respectively,
   wherein a total resistance value of the fuse box changes according to the number of the fuses that have been cut.

10. The semiconductor device according to claim 6, wherein each of the first to fourth switches is a fuse.

11. The semiconductor device according to claim 10, wherein the first and fourth switches are disconnected when the output voltage of the operational amplifier is higher than the desired voltage, and the second and third switches are disconnected when the output voltage of the operational amplifier is lower than the desired voltage.

12. The semiconductor device according to claim 6, wherein the first to fourth switches are metal oxide semiconductor (MOS) transistors.

13. The semiconductor device according to claim 12, wherein the switching unit further includes a control signal setting unit outputting first to fourth control signals to control the first to fourth switches in response to an external signal, respectively.

14. The semiconductor device according to claim 13, wherein the switching unit activates the second and third control signals and inactivates the first and fourth control signals when the output voltage of the operational amplifier is higher than the desired voltage, and activates the first and fourth control signals and inactivates the second and third control signals when the output voltage of the operational amplifier is lower than the desired voltage.

15. A semiconductor device comprising:
an operational amplifier (OP-AMP), wherein a first input terminal of the OP-AMP receives a reference voltage and a second input terminal of the OP-AMP receive a feedback voltage;
a fusebox, wherein an input of the fusebox is connected to the second input terminal and an output of the fusebox is connected to an output terminal of the OP-AMP, wherein the fusebox is configurable to one of a plurality of different resistance values;
first through fourth switches; and
first through second resistors,
wherein the first resistor is connected between the output terminal of the OP-AMP and the first switch and second switches, and the second resistor is connected between a ground terminal and the second and fourth switches,
wherein the first switch is configured to connect the first resistor to the output of the fusebox, wherein the second switch is configured to connect the second resistor to the output of the fusebox, wherein the third switch is configured to connect the first resistor to the input of the fusebox, and wherein the fourth switch is configured to connect the second resistor to the input of the fusebox.

16. The semiconductor device of claim 15, further comprising a control signal setting circuit configured to output one of first control signals to open the first and fourth switches and close the second and third switches or output second control signals to open the second and third switches and close the first and fourth switches.

17. The semiconductor device of claim 16, wherein the control signal setting circuit is configured to output the first control signals when an output voltage of the output terminal of the OP-AMP exceeds a desired voltage and output the second control signal when the output voltage of the output terminal of the OP-AMP is less than the desired voltage.

* * * * *